United States Patent [19]

Yunus

[11] Patent Number: 5,150,120

[45] Date of Patent: Sep. 22, 1992

[54] MULTIPLEXED SIGMA-DELTA A/D CONVERTER

[75] Inventor: Mohammad Yunus, Fremont, Calif.

[73] Assignee: Harris Corp., Melbourne, Fla.

[21] Appl. No.: 637,047

[22] Filed: Jan. 3, 1991

[51] Int. Cl.$^5$ ............................................... H03M 3/02
[52] U.S. Cl. ................................................... 341/143
[58] Field of Search ............... 341/143, 155, 122, 141; 375/125, 26

[56] References Cited

U.S. PATENT DOCUMENTS

| | | | |
|---|---|---|---|
| 2,949,505 | 8/1960 | Kretzmer | 375/25 |
| 3,471,648 | 10/1969 | Miller | |
| 3,518,548 | 6/1970 | Greefkes et al. | 375/26 X |
| 3,594,509 | 7/1971 | Shimamura | 341/143 X |
| 3,745,562 | 7/1973 | Rosenbaum | 341/143 |
| 4,951,052 | 8/1990 | Jacob et al. | 341/122 |
| 4,968,987 | 11/1990 | Naka et al. | 341/143 |

Primary Examiner—Sharon D. Logan
Attorney, Agent, or Firm—Joel I. Rosenblatt

[57] ABSTRACT

A sigma-delta analog-to-digital converter employs multiplexed single-loop modulators in parallel and respectively phased time-divided clocks. The parallel modulators have the effect of producing digital output at a high sampling frequency that is a multiple of the phased switching frequencies applied to the modulator circuits. In one preferred embodiment, four second-order sigma-delta modulators are driven in clocked phased sequence and combined by a multiplexor circuit. Another embodiment employs second-order modulators using RC integrators. A further embodiment replaces the multiplexor with an adder when in-phase modulator clocks are used, and the adder also acts as a simple low pass filter.

20 Claims, 12 Drawing Sheets

MULTIPLEXED SIGMA-DELTA A/D CONVERTER

FIELD OF INVENTION

The present invention relates to an analog-to-digital (A/D) converter, and particularly, to one of the sigma delta type having an improvement in configuration for greater speed.

BACKGROUND OF INVENTION

Conventional analog-to-digital (A/D) converters of the sigma delta type use oversampling of an analog input signal in order to process the signal using low resolution components and digital filtering to obtain a digital representation of the analog input signal. Such A/D converters can be efficiently implemented in VLSI technologies because most of the circuit components are digital, and low-precision analog components are sufficient even for high accuracy conversions.

Figure 1:
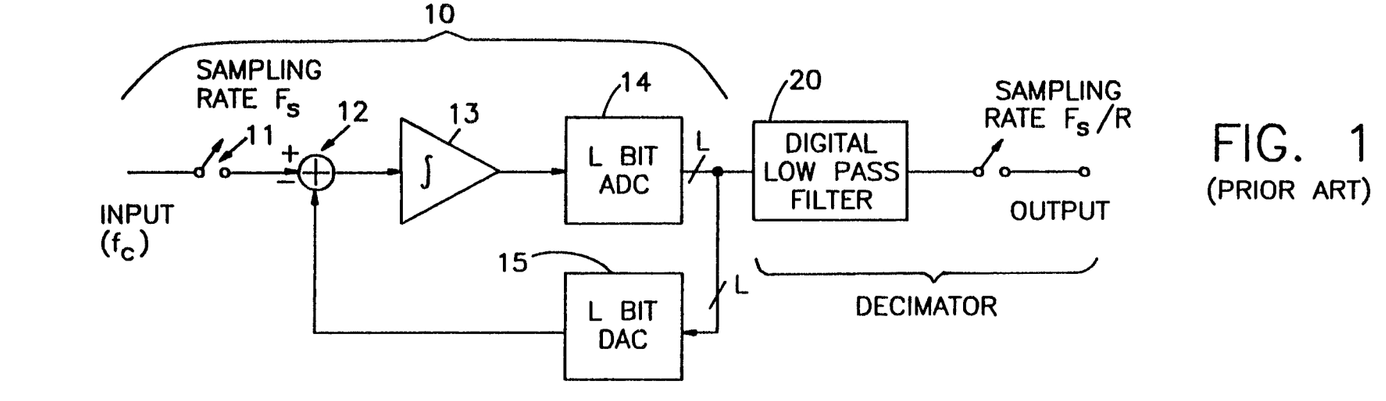
FIG.1 is a general block diagram of a conventional sigma-delta A/D converter.

A general block diagram of a typical sigma-delta A/D converter is shown in FIG. 1. It consists of an analog front end 10, which is also called a sigma delta modulator, and a digital low pass filter 20. The analog input signal of bandwidth fc is sampled at a very high sampling rate, Fs, by the modulator 10. The ratio of Fs/(2fc) is called the over sampling ratio F. The output of the modulator 10 is typically a serial digital signal containing the digital representation of the analog signal along with quantization noise. The output of the modulator 10 is filtered by the digital low pass filter 20 to remove most of the quantization noise from the digital signal for frequencies higher than fc. Finally, the filtered digital signal can be sampled at the 2fc rate to represent the analog signal of bandwidth fc in the digital domain. The digital low pass filter 20 and output sampling are referred to as a "decimator" in the drawing.

Figure 2:
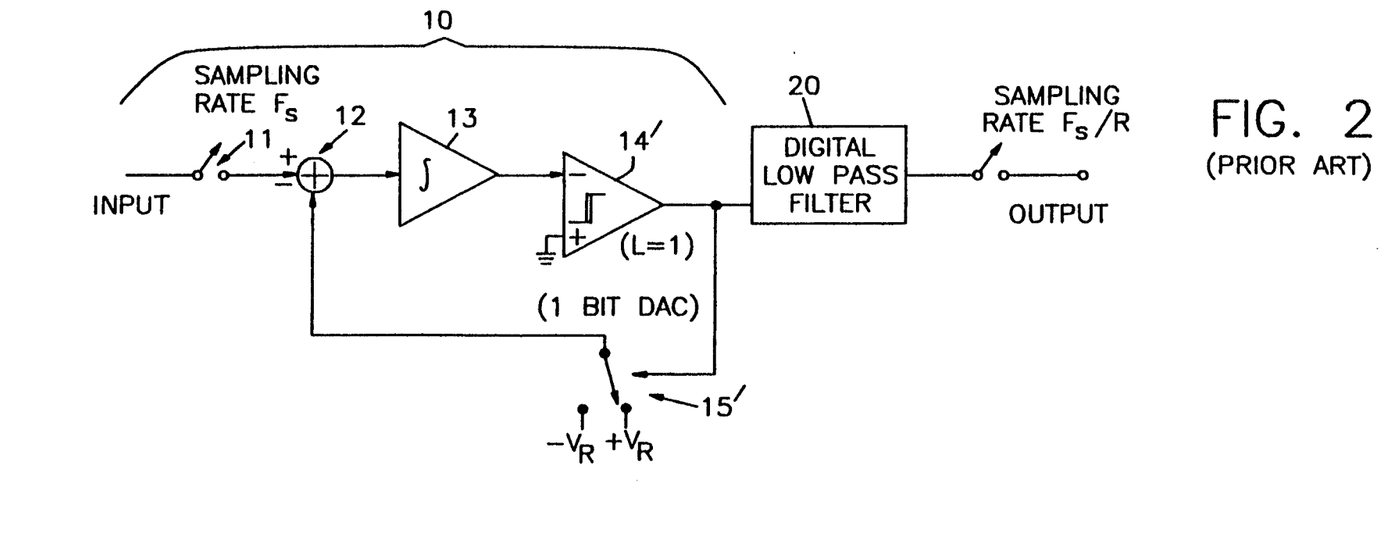
FIG. 2 is a simplified diagram of a conventional first-order sigma-delta A/D converter.

As shown in FIG. 1, the sigma-delta modulator 10 generally consists of a sampling circuit a differencing circuit 12, an integrator 13 or analog filter, an A/D converter 14 of "L" bit resolution, and a feedback D/A converter 15 also of "L" bit resolution. The number L is typically one for a first-order sigma-delta modulator, which reduces the internal A/D converter to a simple comparator circuit 14' and the D/A converter to a pair of switches 15' connected to reference voltages +Vr and -Vr, as shown in FIG. 2.

The basic function of the sigma-delta modulator (analog front end) is to sample the analog input signal at a much higher rate than (typically 64 to 256 times) the analog input signal frequency and to produce a serial stream of output digital bits and words. The average value of the serial digital output is equal to the analog input signal due to the feedback circuit. Moreover, the integrator 13 or analog filter in the feedback loop shapes the quantization noise of the internal A/D converter. Thus, the spectrum of the serial digital output contains the analog input signal and the shaped quantization noise.

Figure 3:
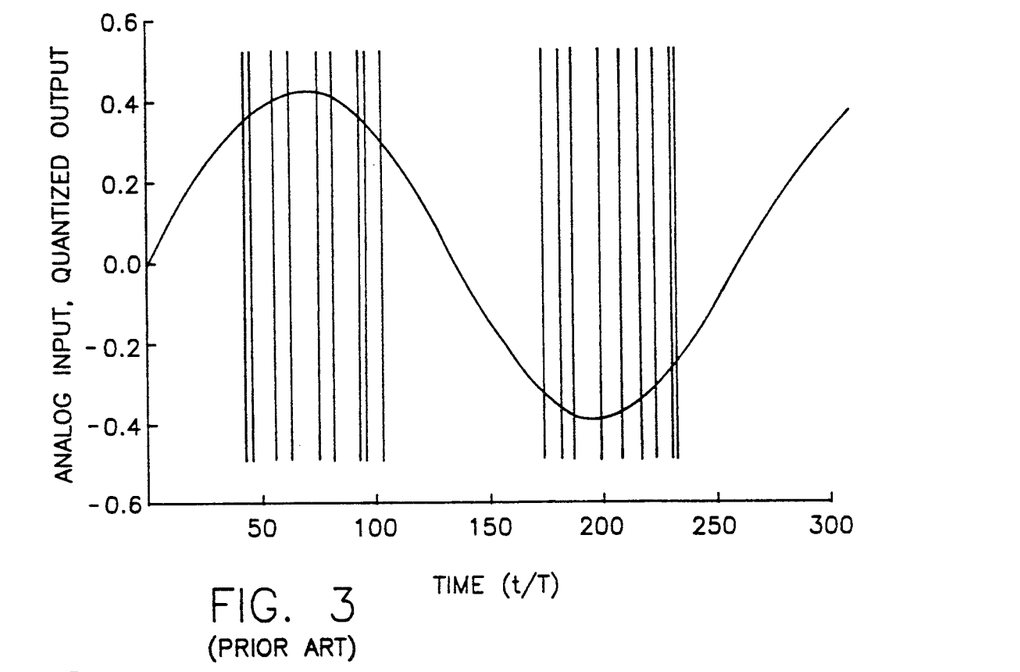
FIG. 3 is a diagram showing a typical sinusoidal input and quantized output of the conventional first-order sigma-delta modulator.

The shape of the quantization noise is such that a very small energy of the noise is in the baseband or signal bandwidth, and most of the energy of the noise is in the higher frequency region which is to be removed by the digital filter 20 of the decimator. Referring to FIG. 3, the quantized output of a first-order (one integrator in the feedback loop) sigma-delta modulator is shown for a sinusoidal analog input. The output is predominantly high when the input signal is close to its peak and mostly low for signal valleys. The output appears to be a 50% duty cycle signal for the input signal close to zero.

Figure 4:
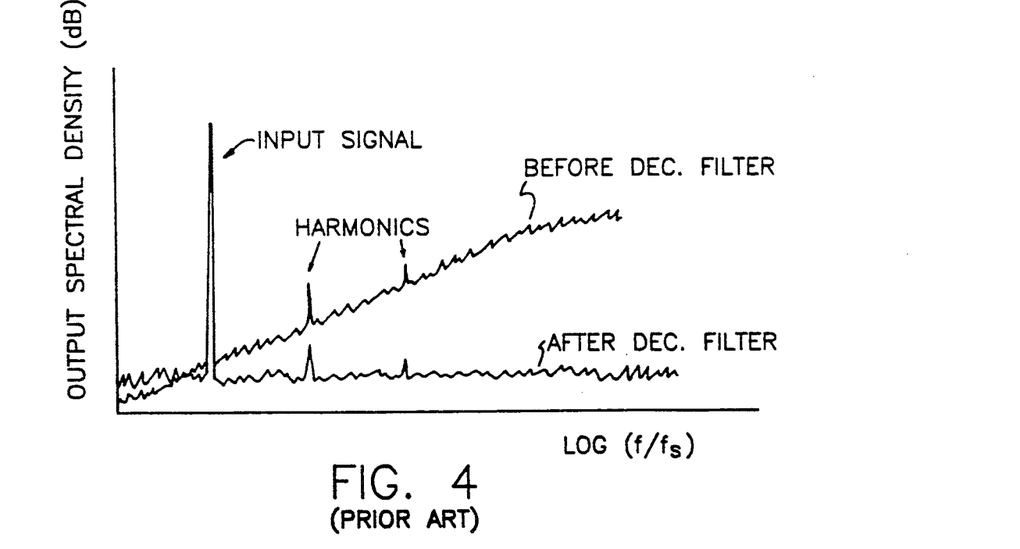
FIG. 4 is a diagram showing the spectral density of the output signal of the conventional first-order sigma-delta modulator before and after passing through a decimation filter.

In FIG. 4, the spectrum density of the output of the sigma-delta modulator is illustrated labelled as "before dec. (decimator) filter". The noise is shaped as a linear function of frequency due to there being one integrator in the modulator loop. A decimating low pass filter can remove the high frequency components of the noise, resulting in the final output spectrum labelled as "after dec. filter".

Figure 5:
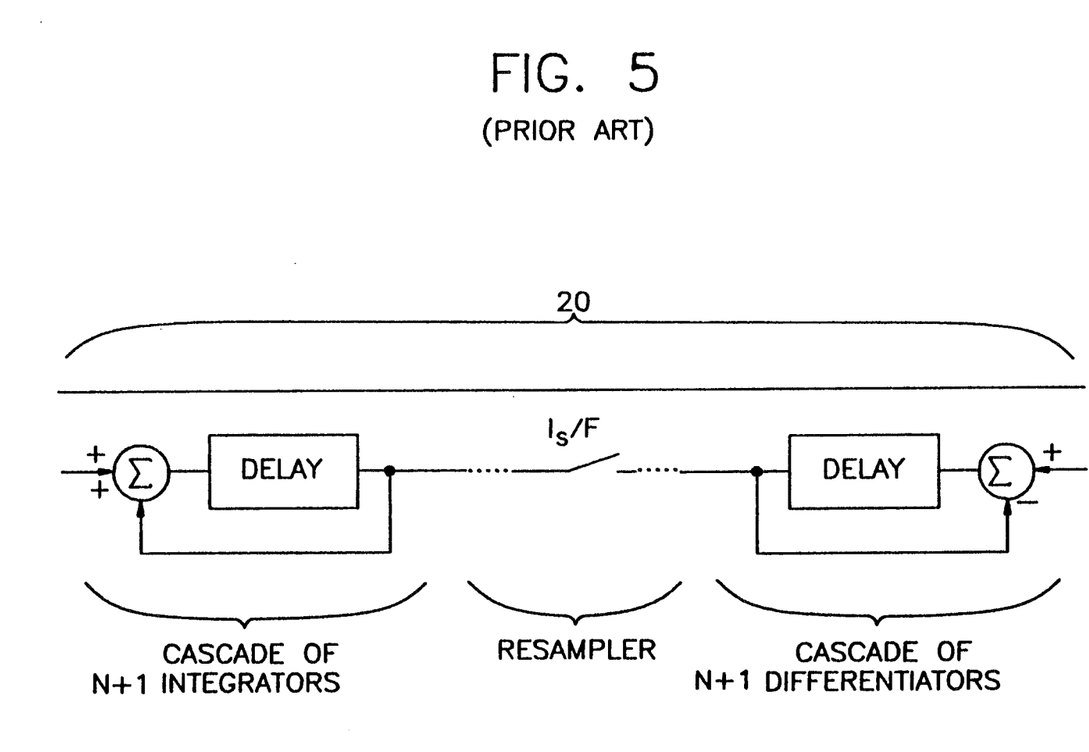
FIG. 5 is a general block diagram showing a conventional COMB-type decimation filter for the sigma-delta A/D converter.

The basic function of the digital filter of the decimator is to remove the quantization noise from the output of the modulator 10. The output signal bandwidth is much smaller than the modulator sampling rate, so the output can be computed at a much slower rate (2fc) without loss of any information. Thus, the filter is called a low pass decimation filter as the sampling rate is down sampled from Fs to 2fc. The filtering is achieved using several stages. One type of filter is called a COMB filter, as illustrated in FIG. 5, which consists of an (N+1) cascade of integrators coupled, via a resampler at a sampling rate of Fs/F, to a (N+1) cascade of differentiators in order to implement the following filter transfer function:

$$H(Z) = \{1/F \times (1-Z^{-F})/(1-Z^{-1})\}^{N+1}$$

The integrators operate at a high sampling rate Fs, whereas the differentiators operate at a much reduced rate of Fs/F, which is equal to 2fc. The cutoff frequency of the filter is kept at fc.

The accuracy of the analog to digital conversion is dependent on the oversampling ratio and topology of the modulator. The accuracy is calculated by computing the ratio of the signal to noise in the baseband fc of the filtered signal. A detailed analysis of such calculation is described in the paper "A Use of Double Integration in Sigma Delta Modulation", by James Candy, Bell Laboratories, in IEEE Trans. on Communications, Vol. COM-33, No. 3, March 1985. As an example, the signal spectrum of the first order system illustrated in FIG. 4 has the noise energy linearly increasing with frequency. Thus, if the bandwidth is reduced by oversampling, more than a linear proportion of the noise will be excluded. For example, a gain in signal-to-noise ratio of (9L-5.2) db, where L is the number of octaves of oversampling (oversampling ratio $F=2^L$), is discussed in "Circuit and Technology Considerations for MOS Delta-Sigma A/D Converters", by Max Hauser and Robert Brodersen, University of California at Berkeley, in IEEE Publication CH2255-8/86, pp. 1310–1315, 1986. If the oversampling ratio is 64, or 6 octaves, then the signal-to-noise ratio will be 49 db or 8 bits. If the oversampling ratio is increased to 256, or 8 octaves, the signal-to-noise ratio is increased to 67 db or 11 bits of resolution. Thus, the accuracy is higher for higher values of the oversampling ratio as the noise is lowered in the baseband.

Figure 6:
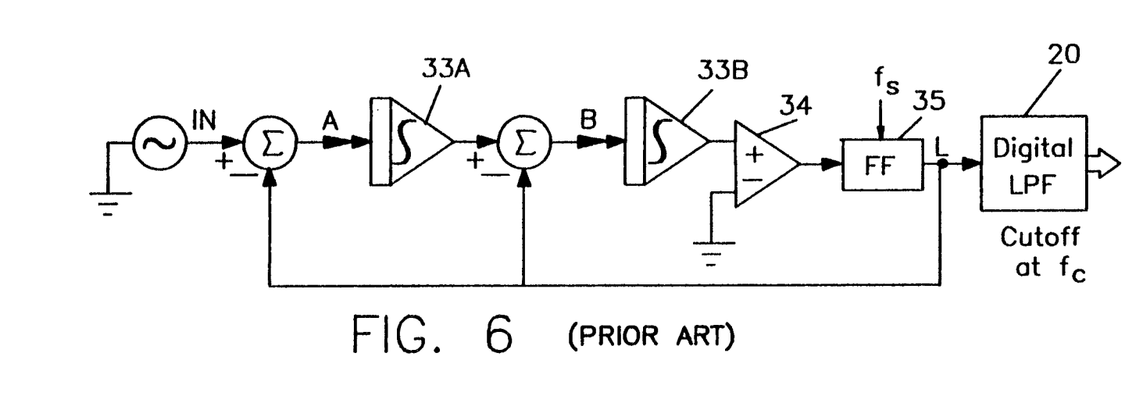
FIG. 6 is a simplified diagram of a conventional second-order sigma-delta A/D converter.

Another factor in the accuracy of the modulator is the shape of the noise. The first-order system has a linear shape for the noise spectrum due to the use of the one integrator in the modulator loop. Higher-order systems may have a plurality of integrators which gives the noise a more complex spectrum shape. For example, a second-order sigma-delta A/D converter is shown in FIG. 6 using two integrators 33A and 33B coupled to a comparator 34, a latch (FF) 35, and the digital low pass filter 20. The latch (FF) 35 is switched between reference voltages and acts as a one-bit DAC for feeding back the loop signal to the summing nodes A, B. The circuit operates at a clock corresponding to the sampling rate fs for optimum performance. The serial data from the modulator are provided at frequency fs to the filter. Thus, if the signal bandwidth is fc, the maximum oversampling ratio is $F = fs/2fc$.

Figure 7A:
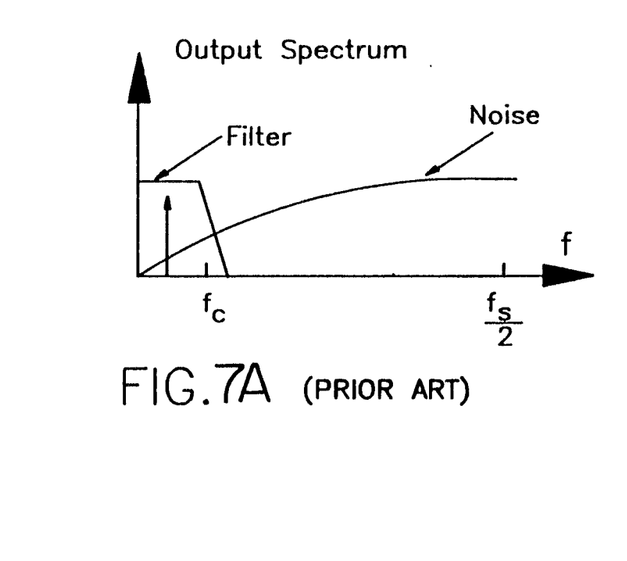
FIG. 7A is a diagram showing the spectral density of the output signal of the second-order sigma-delta modulator.
Figure 7B:
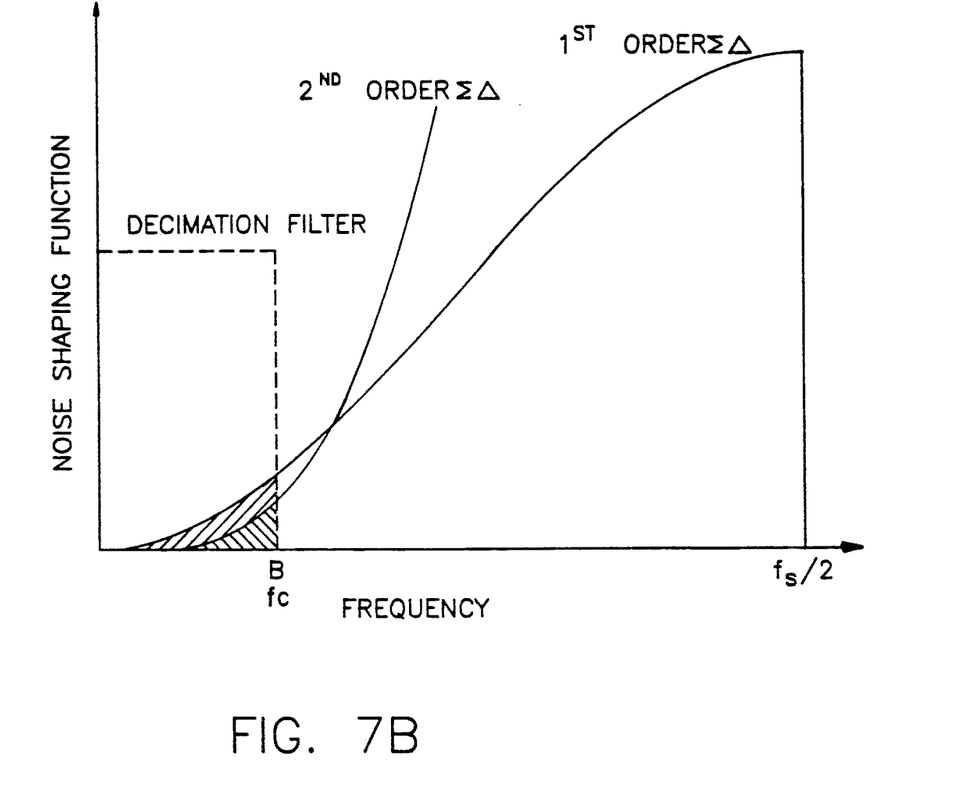
FIG. 7B is a diagram illustrating the noise shape of the outputs of the first-order and second-order sigma-delta modulators.

The resulting spectrum of the output of the second-order system is shown in FIG. 7A having a square law characteristic. The second integrator further decreases the noise energy in the baseband compared to a first-order system, as shown in FIG. 7B. Thus, the improvement in signal-to-noise ratio, which is 9 db or 1.5 bits of resolution for each doubling of the oversampling ratio for the first-order system, is now 15 db or 2.5 bits for each doubling of the oversampling ratio for the second-order system. Similarly, the improvement in signal-to-noise ratio for a third order system is 21 db/octave or 3.5 bits/octave. Generalizing this relationship, the improvement in signal-to-noise ratio for a N order system is $(6N+3)$ db/octave or $(0.5+N)$ bits/octave. A further discussion of oversampling as a technique for high resolution A/D conversion is given in "A Higher Order Topology for Interpolative Modulators for Oversampling A/D Converters", by Kirk Chao, et al., IEEE Trans. on Circuits and Systems, Vol. 37, No. 3, March 1990.

Another approach to obtaining higher-order noise-shaping is to cascade several first-order modulators. The first modulator converts the analog input signal, and the subsequent modulators convert the quantization noise generated by the previous modulator. The quantization errors of all but the last modulator are digitally cancelled, yielding a noise shaping function of order equal to the number of first-order modulators. Advantages of the cascaded sigma-delta approach include guaranteed stability to any order, limited signal swing at the output of the integrator, and pipelining of the integrators. The main disadvantage of the cascaded technique is that the S/N ratio is more sensitive to analog component accuracy. A further discussion of cascaded sigma-delta modulators is provided in "A High-Resolution CMOS Sigma-Delta A/D Converter", by Mike Rebeschini, et al., IEEE Publication CH2692-2/89, pp. 246-249, 1989.

Figure 8:
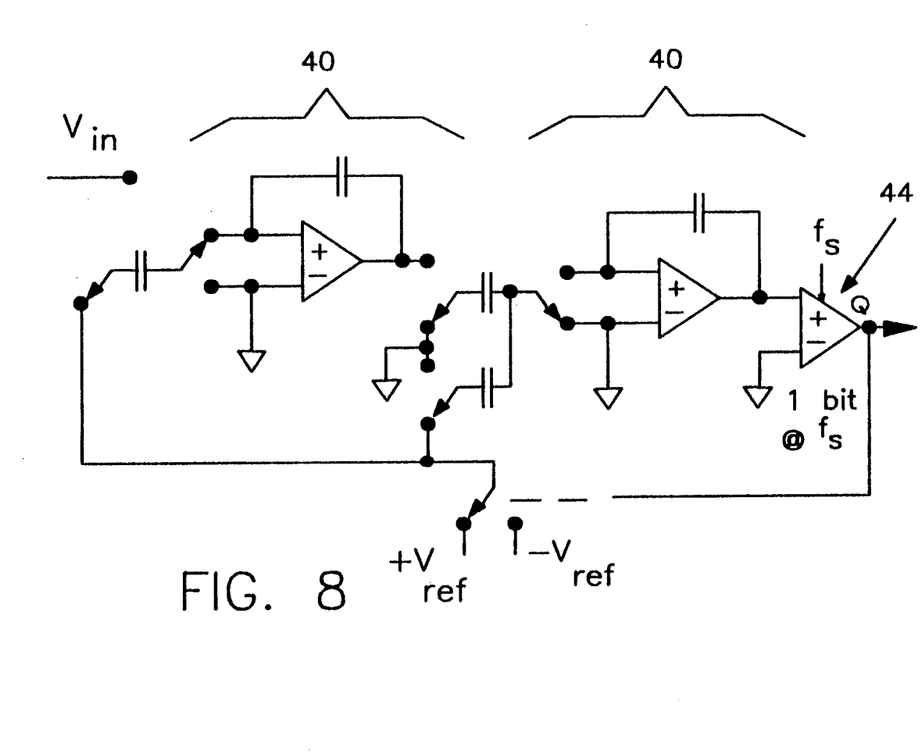
FIG. 8 is a simplified circuit diagram of a conventional switched-capacitor second-order sigma-delta modulator.

One implementation of the higher-order modulator employs switched-capacitor couplings between integrators. An example of a second-order switched-capacitor sigma-delta modulator is shown in FIG. 8A having two integrator stages 40, A/D comparator 44, and switched-capacitor couplings. The comparator is switched with a clock at the sampling rate fs. The output spectrum and noise shape are similar to those shown in FIGS. 7A and 7B. A further discussion of switched-capacitor sigma-delta systems is provided in "Delta-Sigma A/Ds with Reduced Sensitivity to Op Amp Noise and Gain", by Paul Hurst, et al., IEEE publication CH2692-2/89, pp. 254-257, 1989.

Thus, the prior art has taken the approach of using higher-order modulators and higher sampling frequencies to obtain higher accuracy converters for processing wide bandwidth signals. However, only first-order systems are unconditionally stable. Second and multi-order systems have stability problems for some input conditions. The higher sampling systems use high oversampling ratios to obtain high precision converters for low bandwidth signals or dc levels. However, the sampling rate of the modulator is limited by the characteristics of the analog circuit components. Cascaded systems are commonly used, but have the problem that the S/N ratio is sensitive to analog component accuracy. Thus, new circuit techniques are needed to improve the effective sampling rate, speed, and accuracy of sigma-delta converters for better analog-to-digital performance, especially for high frequency applications and very high precision, low frequency applications.

SUMMARY OF INVENTION

It is therefore a principal object of the invention to overcome the sampling frequency limitations of the analog front end of the conventional sigma-delta A/D converter designs, and to achieve higher sampling speeds for improved performance without compromising accuracy. It is a particular object to provide an improved modulator configuration which will increase the effective sampling rate of the analog front end without exceeding its characteristic limits of stability and sensitivity.

In accordance with the invention, a sigma-delta analog-to-digital converter employs a plurality N of sigma-delta modulators in parallel controlled by respective modulator clocks and a signal combining circuit for combining the output digital signals of the modulators into an overall output digital signal having an effective sampling rate N times that of the individual modulators. In one preferred embodiment, four second-order sigma-delta modulators are driven in clocked phased sequence and combined by a multiplexor circuit. Another embodiment employs second-order modulators using RC integrators. A further embodiment replaces the multiplexor with an adder when in-phase modulator clocks are used, so that the digital bits from the modulators are added together in each cycle and the digital sum is sent to the digital filter. The adder also acts as a simple low pass filter.

BRIEF DESCRIPTION OF DRAWINGS

The above objects and further features and advantages of the invention are described in detail below in conjunction with the drawings, of which.

DETAILED DESCRIPTION OF PREFERRED EMBODIMENTS

Figure 9A:
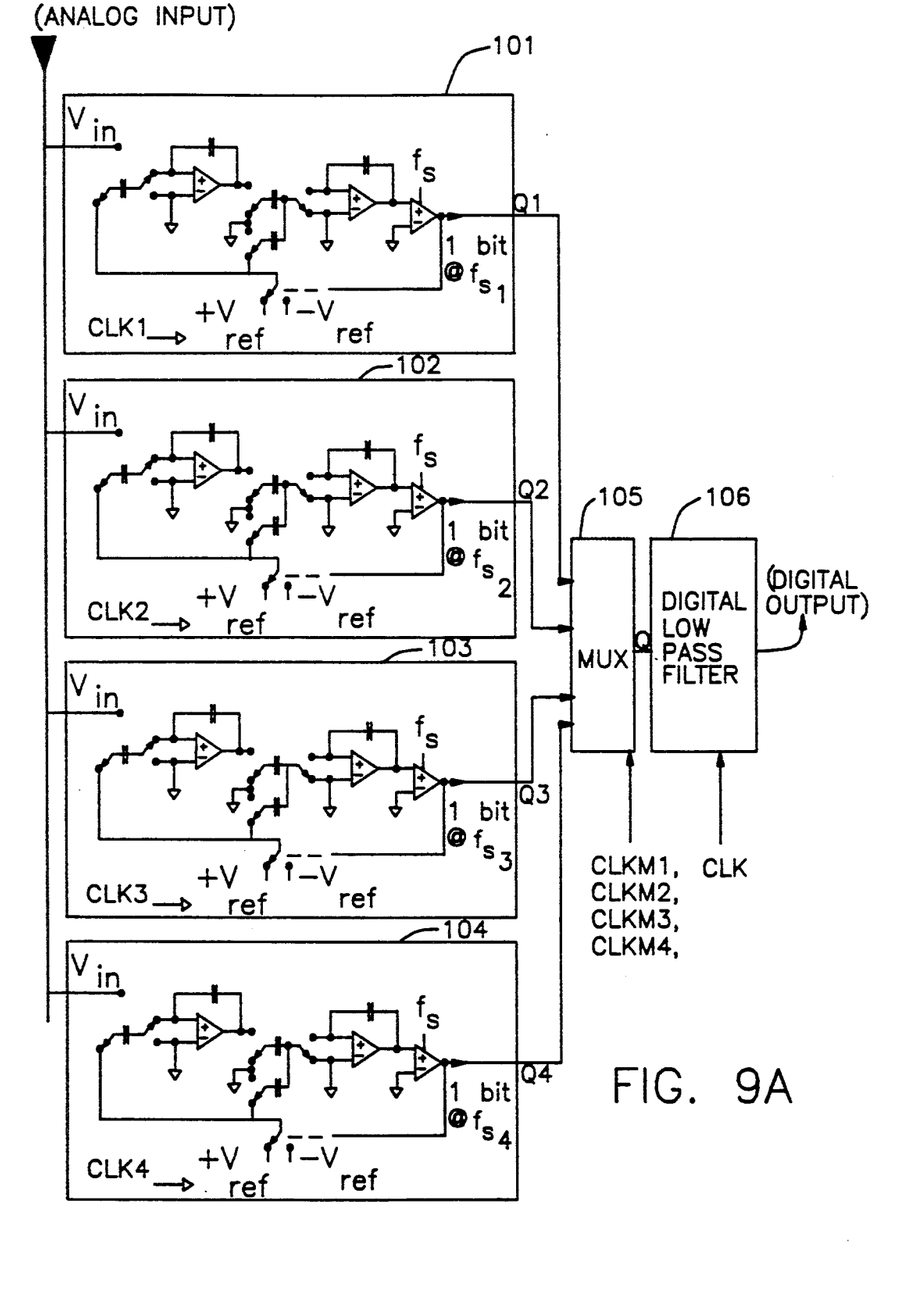
FIG. 9A is a simplified circuit diagram of sigma-delta A/D converter using sigma-delta modulators multiplexed in parallel in accordance with the invention, wherein four second-order modulators of the switched-capacitor type are used.

Referring to FIG. 9A, a sigma-delta A/D converter in accordance with the invention has four sigma-delta modulators 101, 102, 103, 104 in parallel which have their outputs Q1, Q2, Q3, Q4 multiplexed together through a multiplexor circuit 105 and passed through a digital low pass filter circuit 106. Each of the modulators is implemented as a second-order sigma-delta modulator of the switched capacitor type, as previously described with respect to FIGS. 6, 7A, 7B, and 8. Each modulator stage is provided with the analog input signal to Vin and a modulator clock CLK1, CLK2, CLK3, CLK4, respectively. The analog input signal is sampled by all four second-order modulators. Clocks are generated such that the master clock CLK is four times faster than the modulator clocks CLK1, CLK2, CLK3, CLK4. In one version, the modulator clocks are staggered in phased sequence over time. Thus, the output of each modulator will appear as the signal processing is done on a different part of the signal, i.e., the signal is sampled every fourth master clock cycle respectively for each modulator. The outputs Q1, Q2, Q3, Q4 of the modulators are sampled by the multiplexor, via multiplexor clocks CLKM1, CLKM2, CLKM3, CLKM4, so that the overall output Q appears to have a data rate of the master clock CLK and all the modulator outputs are combined in correct phase sequence.

Figure 9B:
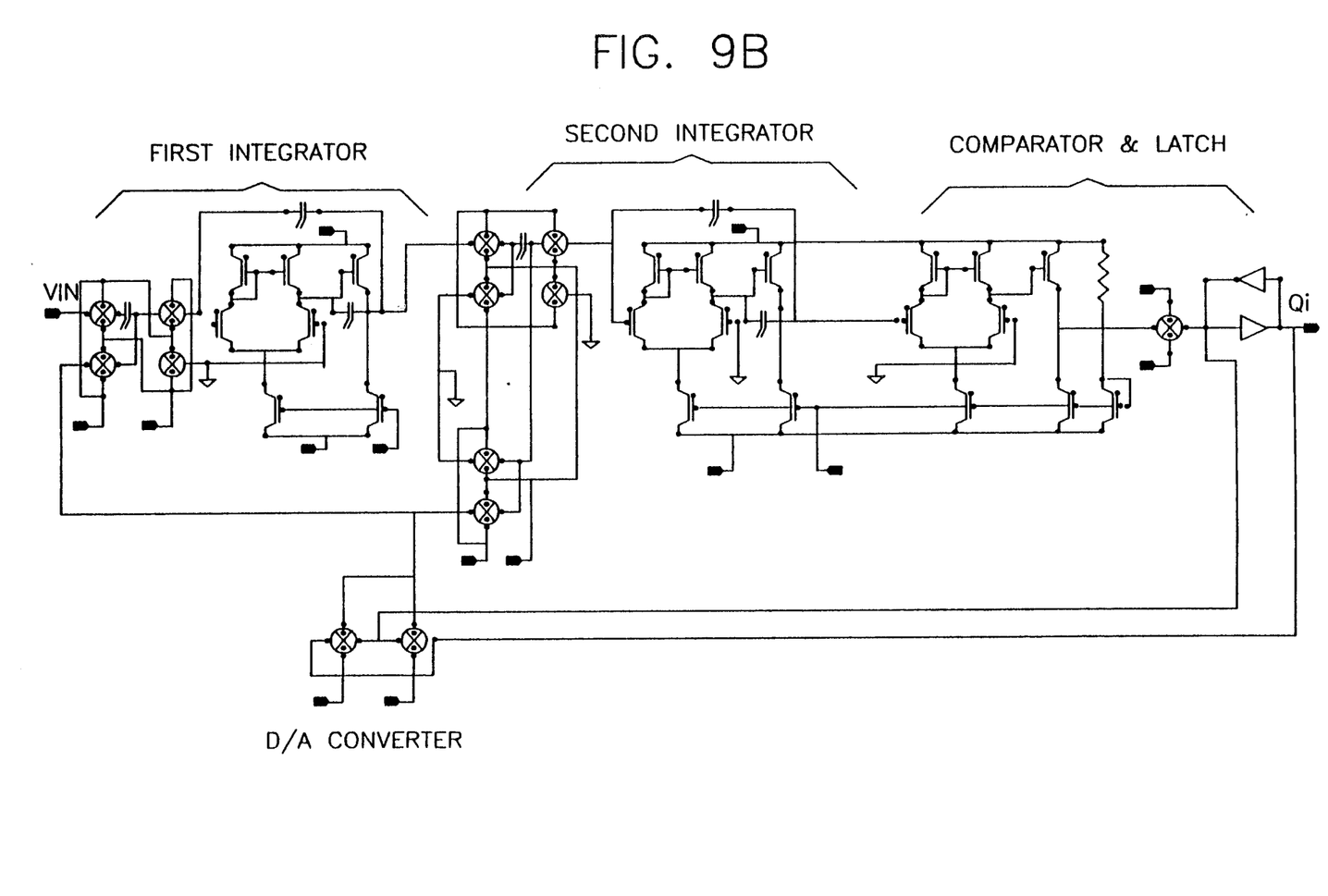
FIG. 9B is a circuit diagram of one representative sigma-delta modulator of the A/D converter of FIG. 9A implemented in IC form.

In FIG. 9B, one such sigma-delta modulator stage is shown implemented in MOS technology. The transmission gates for the integrators are NMOS and PMOS having drain and source coupled together. The NMOS gate is driven by the modulator clock CLKi, and the gate of the PMOS gate is driven by the complementary clock CLKB. Bias circuitry is not shown as there are several commonly known circuits for properly biasing operational amplifiers and comparators. The clock generator circuitry is not shown as the generation of correct timing control signals is well known to those versed in digital logic.

Figure 10:
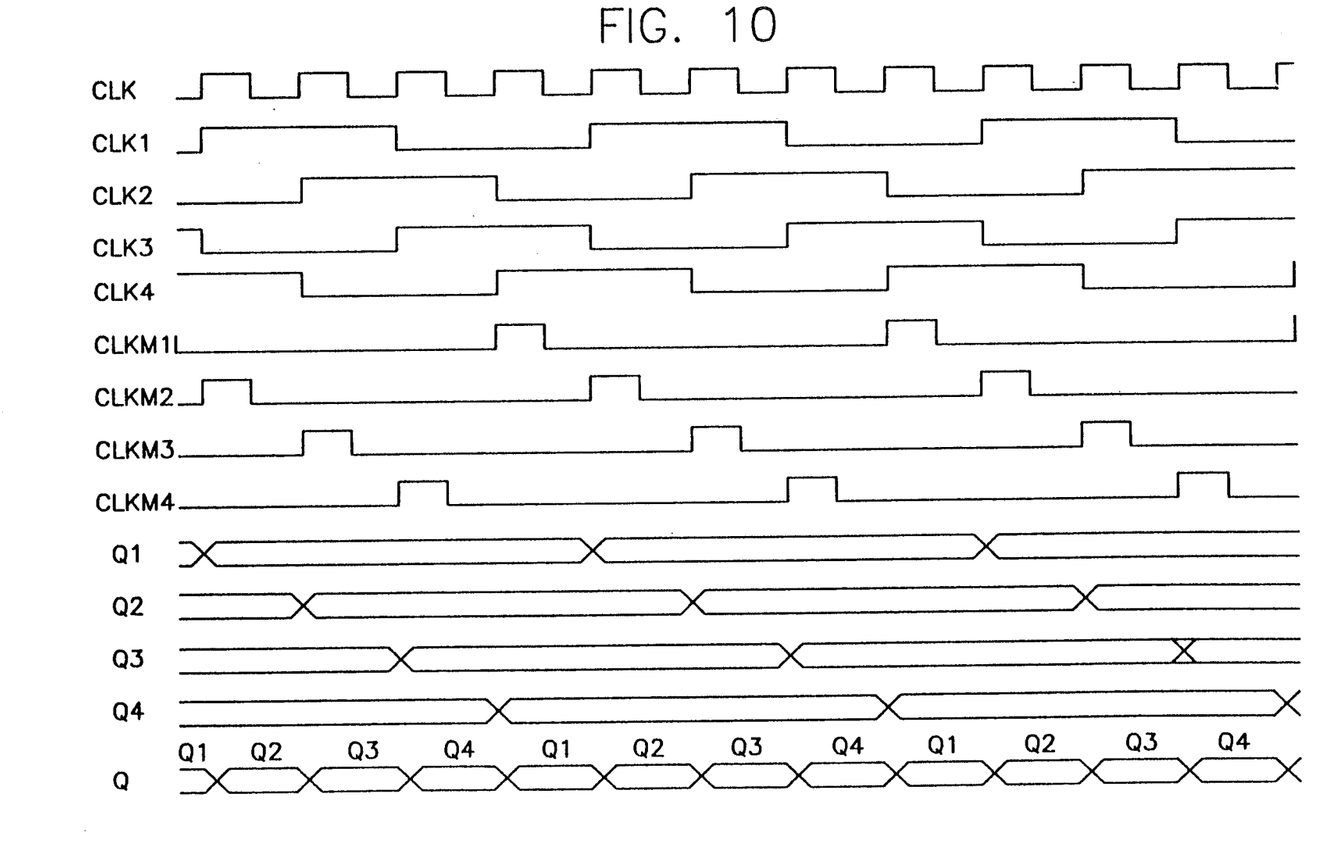
FIG. 10 is a timing diagram for the clocks of the four multiplexed second-order modulators of FIG. 9A in which the clocks are in phased sequence.

In FIG. 10, the timing of the master clock CLK, modulator clocks CLK1, CLK2, CLK3, CLK4, multiplexor clocks CLKM1, CLKM2, CLKM3, CLKM4, modulator outputs Q1, Q2, Q3, Q4, and combined overall output Q are shown. In this version, the modulator clocks each have a period of four master clock periods and are staggered in phased sequence.

Figure 11:
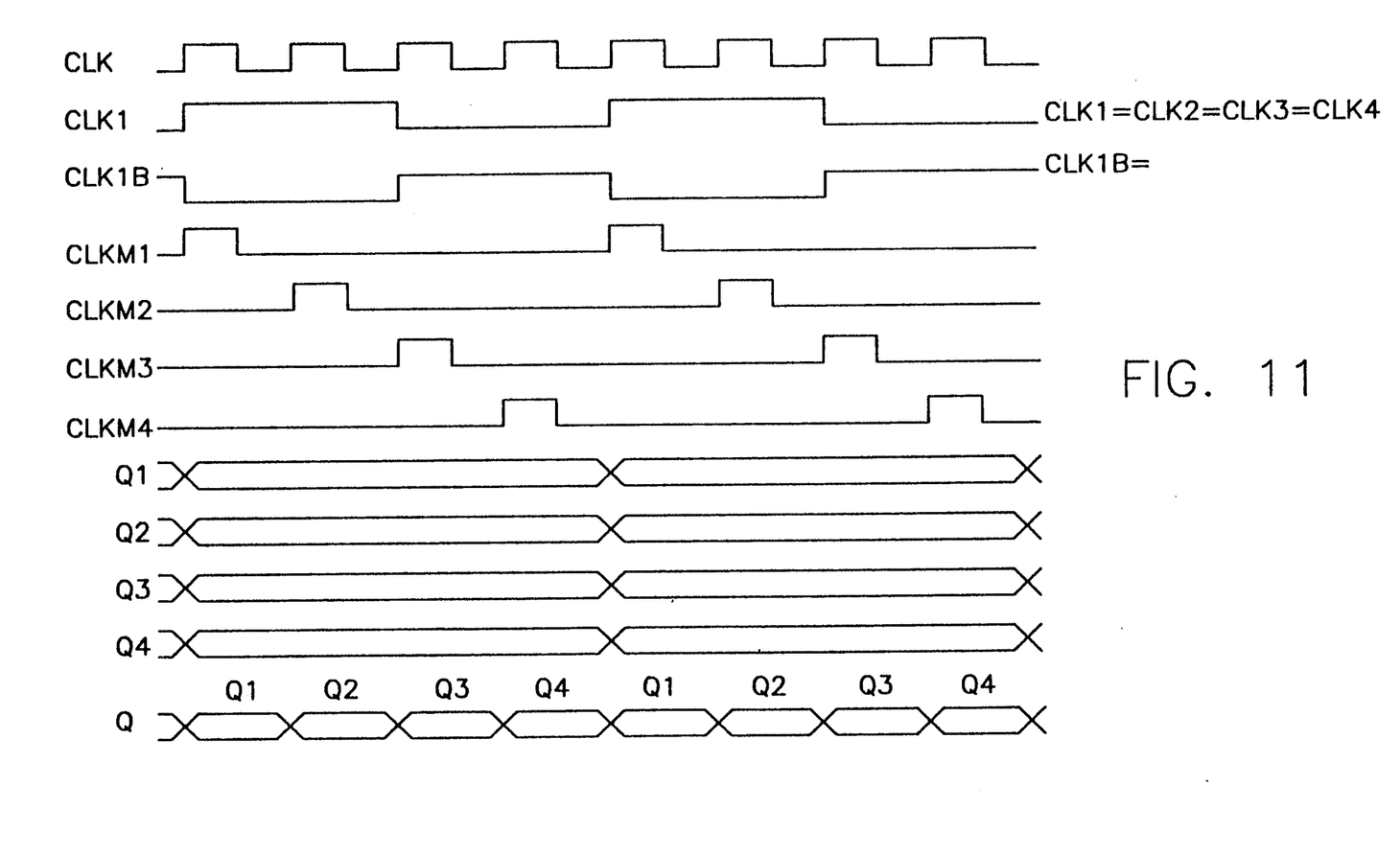
FIG. 11 is a timing diagram for the clocks of the four multiplexed second-order modulators of FIG. 9A in which the clocks are in phase with each other.

In FIG. 11, an alternative version uses one modulator clock CLK1 for all modulators, i.e., CLK1 is equal and in phase with CLK2, CLK3, and CLK4. The high-level portion of the period of each modulator clock CLK1 extends over two master clock periods, and the complementary signal CLK1B extends over a trailing two master clock periods. The staggered multiplexor clocks CLKM1, CLKM2, CLKM3, CLKM4, which are in phased sequence, result in the signal portions of the modulator outputs Q1, Q2, Q3, Q4 being combined with the proper timing into the overall converter digital output signal Q.

Figure 12:
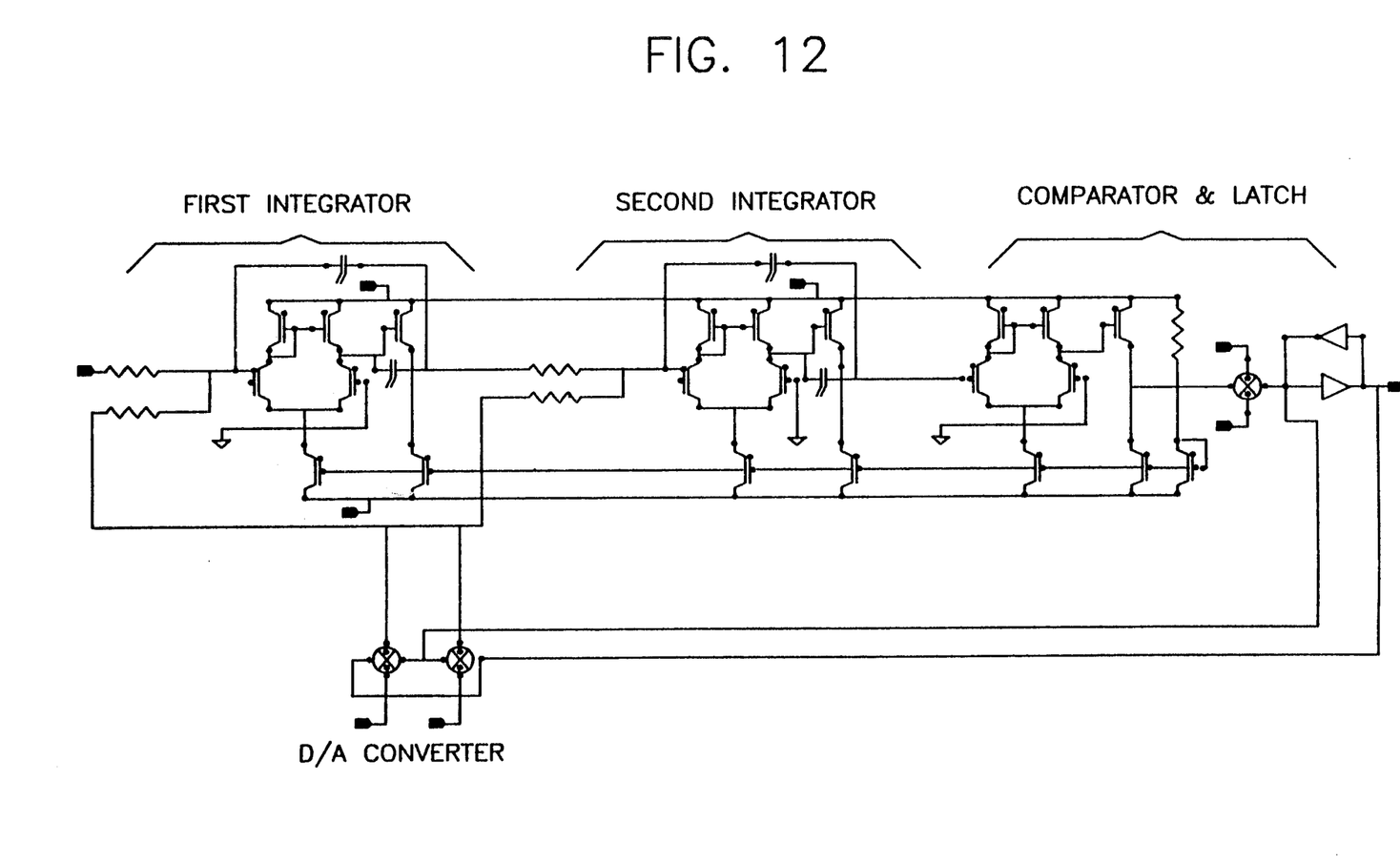
FIG. 12 is a circuit diagram of another version of the sigma-delta modulator implemented in IC form using RC integrators.

In FIG. 12, another embodiment of the second-order sigma-delta modulator is shown in IC form using RC integrators. Each integrator stage includes an integrating resistor (1000) and an integrating capacitor (Type A). The timings for the clock signals of this circuit may be the same as shown in FIGS. 10 and 11.

Figure 13:
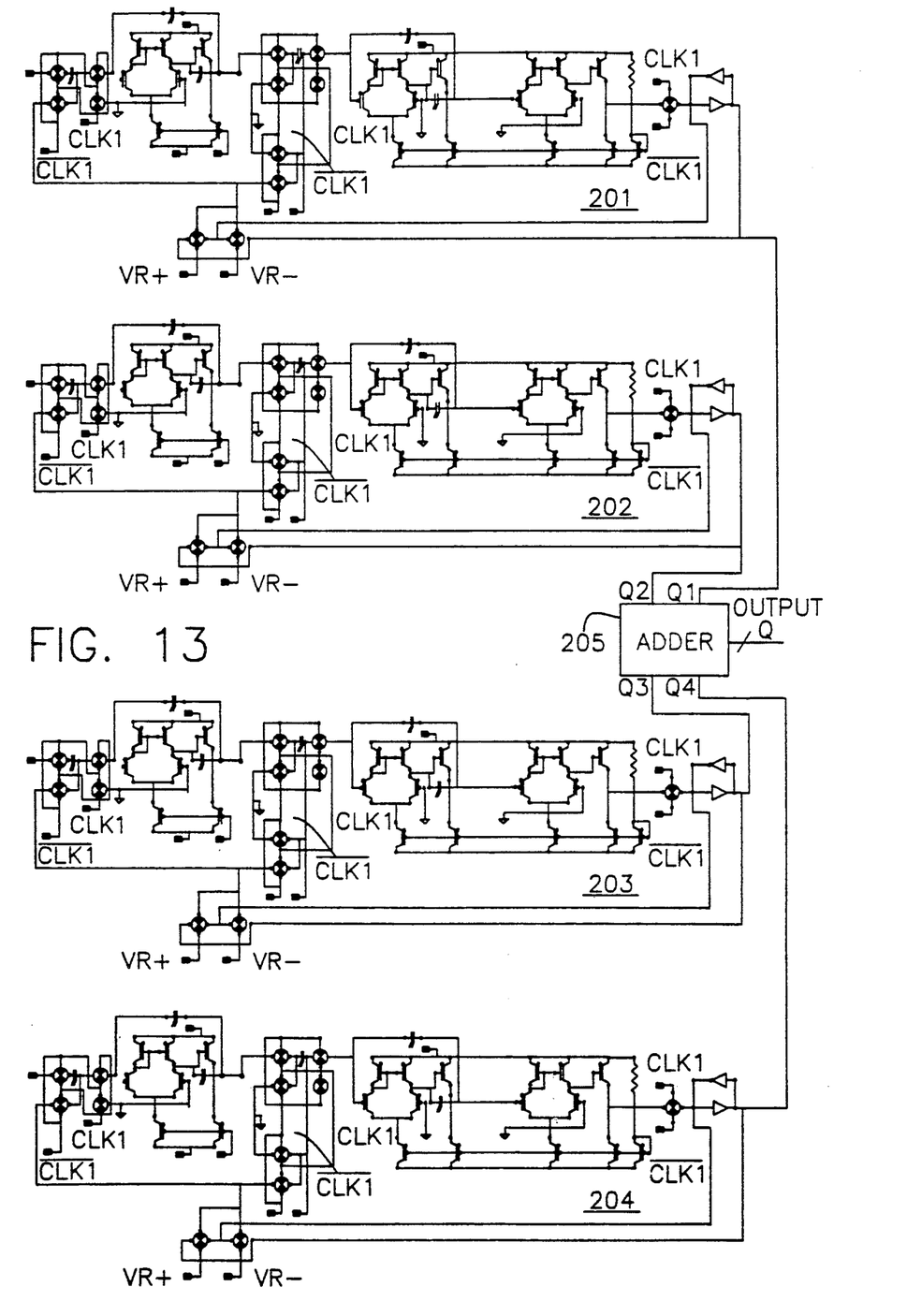
FIG. 13 is an IC circuit diagram of another embodiment of the multiplexed sigma-delta A/D converter of the invention in which the multiplexor is replaced with an adder when in-phase modulator clocks are used.

In FIG. 13, a further embodiment of the invention has parallel modulator stages 201, 202, 203, 204 similar to those described previously with respect to FIGS. 9A and 9B, but the multiplexor is replaced with an adder 205. This embodiment is operable when in-phase modulator clocks are used. The modulator outputs Q1, Q2, Q3, and Q4 are simply added together to produce the combined overall output Q. Thus, four bits from the modulators are added together in each cycle and the three-bit wide sum is sent to the digital filter. Generally, the implementation of the COMB-type filter on a single bit stream is easier. The adder also acts as a simple low pass filter.

In accordance with the invention, each second-order modulator stage has the advantages of the signal-to-noise ratio and noise shaping of the conventional second-order unit, as described with respect to FIGS. 6, 7A, 7B, and 8, but the four modulator stages in parallel has an effective sampling rate that is four times faster than the comparable conventional device. The analog circuitry of the individual modulators still has time to settle properly and to maintain optimum performance, while the combined multiplexed array delivers four times the oversampling rate, thereby resulting in an improvement in resolution of 30 db or 5.0 bits (15 db for each doubling of the oversampling ratio) for the four multiplexed second-order modulators. The concept may be extended to combine any arbitrary number N of modulators to achieve N times larger a sampling rate for correspondingly improved performance. The individual modulators can also be other or higher-order modulators or cascaded modulators to obtain the required characteristics and an increased sampling to any desirable level. The upper limit of the sampling rate would be set only by the limit of speed of the digital filter, which typically performs at data rates far in excess of the conventional analog front end.

The specific embodiments of the invention described herein are intended to be illustrative only, and many other variations and modifications may be made thereto in accordance with the principles of the invention. All such embodiments and variations and modifications thereof are considered to be within the scope of the invention, as defined in the following claims.

I claim:

1. A sigma-delta analog-to-digital converter comprising:

a plurality N of sigma-delta modulators arranged in parallel having an analog input signal applied thereto and being controlled by a respective modulator clock at a given modulator sampling frequency and providing a respective modulator digital output signal;

signal combining means coupled to said plurality N of sigma-delta modulators for combining the modulator digital output signals from said modulators in phased sequence to form an overall digital output signal, wherein said overall output digital signal has an effective sampling frequency that is a multiple of N times the sampling frequency of the individual modulators; and filtering means for filtering quantization noise from said overall digital output signal.

2. A sigma-delta analog-to-digital converter according to claim 1, wherein said sigma-delta modulators are second-order modulators each containing two integrators in sequence and a comparator/latch circuit as an internal A/D converter.

3. A sigma-delta analog-to-digital converter according to claim 2, wherein said second-order modulators are switched-capacitor type modulators.

4. A sigma-delta analog-to-digital converter according to claim 2, wherein said second-order modulators have respective RC integrators.

5. A sigma-delta analog-to-digital converter according to claim 1, wherein said signal combining means is a multiplexor circuit having a plurality of phased multiplexor clocks applied thereto each corresponding to a respective one of the plurality N of sigma-delta modulators.

6. A sigma-delta analog-to-digital converter according to claim 1, wherein said modulator clocks are in phased sequence with each other.

7. A sigma-delta analog-to-digital converter according to claim 1 wherein said modulator clocks are equal to and in phase with each other.

8. A sigma-delta analog-to-digital converter according to claim 1, wherein said filtering means is a digital low pass filter.

9. A sigma-delta analog-to-digital converter according to claim 1, wherein said signal combining means is an adder for adding the modulator digital output signals together and providing said overall digital output signal.

10. A sigma-delta analog-to-digital converter according to claim 9, wherein said adder also serves as said filtering means by outputting a digital sum signal.

11. A sigma-delta analog-to-digital converter comprising:

a plurality N of sigma-delta modulators arranged in parallel having an analog input signal applied thereto and being controlled by a respective modulator clock at a given modulator sampling frequency and providing a respective modulator digital output signal, wherein said sigma-delta modulators are second-order modulators each containing two integrators in sequence and a comparator/latch circuit as an internal A/D converter;

signal combining means coupled to said plurality N of sigma-delta modulators for combining the modulator digital output signals from said modulators in phased sequence to form an overall digital output signal, wherein said overall digital output signal has an effective sampling frequency that is a multiple of N times the sampling frequency of the individual modulators; and filtering means for filtering quantization noise from said overall output digital signal.

12. A sigma-delta analog-to-digital converter according to claim 11, wherein said plurality N is four in number, and said overall digital output signal has an effective sampling rate that is four times the sampling frequency of the individual modulators.

13. A sigma-delta analog-to-digital converter according to claim 11, wherein said second-order modulators are switched-capacitor type modulators.

14. A sigma-delta analog-to-digital converter according to claim 11, wherein said second-order modulators have respective RC integrators.

15. A sigma-delta analog-to-digital converter according to claim 11, wherein said signal combining means is a multiplexor circuit having a plurality of phased multiplexor clocks applied thereto each corresponding to a respective one of the plurality N of sigma-delta modulators.

16. A sigma-delta analog-to-digital converter according to claim 11, wherein said modulator clocks are in phased sequence with each other.

17. A sigma-delta analog-to-digital converter according to claim 11, wherein said modulator clocks are equal to and in phase with each other.

18. A sigma-delta analog-to-digital converter according to claim 11, wherein said filtering means is a digital low pass filter.

19. A sigma-delta analog-to-digital converter according to claim 17, wherein said signal combining means is an adder for adding the modulator digital output signals together and providing said overall digital output signal.

20. A sigma-delta analog to-digital converter according to claim 19, wherein said adder also serves as said filtering means by a digital sum signal.

* * * * *